United States Patent
Dragt

(10) Patent No.: US 10,670,634 B2
(45) Date of Patent: Jun. 2, 2020

(54) SENSOR FOR MEASURING CURRENT IN A CONDUCTOR

(71) Applicant: Eaton Industries (Netherlands) B.V., Hengelo (NL)

(72) Inventor: Johannes Dirk Gerrit Dragt, Enschede (NL)

(73) Assignee: EATON INTELLIGENT POWER LIMITED, Dublin (IE)

( * ) Notice: Subject to any disclaimer, the term of this patent is extended or adjusted under 35 U.S.C. 154(b) by 355 days.

(21) Appl. No.: 15/522,296

(22) PCT Filed: Oct. 21, 2015

(86) PCT No.: PCT/EP2015/074418
§ 371 (c)(1),
(2) Date: Apr. 27, 2017

(87) PCT Pub. No.: WO2016/066506
PCT Pub. Date: May 6, 2016

(65) Prior Publication Data
US 2017/0315154 A1    Nov. 2, 2017

(30) Foreign Application Priority Data
Oct. 29, 2014    (GB) .................................. 1419192.8

(51) Int. Cl.
*G01R 15/18* (2006.01)
*G01R 19/00* (2006.01)

(52) U.S. Cl.
CPC ......... *G01R 15/181* (2013.01); *G01R 15/185* (2013.01); *G01R 19/0092* (2013.01)

(58) Field of Classification Search
CPC ... G01R 15/181; G01R 15/185; G01R 19/009
See application file for complete search history.

(56) References Cited

U.S. PATENT DOCUMENTS

2003/0214313 A1*  11/2003  Omura ............... G01R 19/0092
                                                           324/713
2010/0176793 A1    7/2010  Michalak
(Continued)

FOREIGN PATENT DOCUMENTS

| JP | 2011185914 A | 9/2011 |
| WO | WO 2012049565 A1 | 4/2012 |
| WO | WO 2013034661 A1 | 3/2013 |

*Primary Examiner* — Patrick Assouad
*Assistant Examiner* — Feba Pothen
(74) *Attorney, Agent, or Firm* — Leydig, Voit & Mayer, Ltd.

(57) ABSTRACT

A sensor, for measuring current in a conductor, has a stack with at least one isolation layer and at least two metallization layers stacked in a z direction, a first winding of conductive material and a second winding of conductive material, the first and second winding each having first and second parts formed in a metallization layer in the stack and mainly extending respectively in y and z directions and respectively having first and second centers of gravity. The first and second centers of gravity are respectively in first and second planes, wherein the first plane intersects with the second plane in a common intersection line in the second direction. The z direction and the y direction are orthogonal. The sensor has measurer configured to measure current through the first and second winding.

8 Claims, 5 Drawing Sheets

(56) References Cited

U.S. PATENT DOCUMENTS

| | | | |
|---|---|---|---|
| 2012/0139534 A1* | 6/2012 | Storkey | G01R 15/181 324/247 |
| 2013/0057267 A1* | 3/2013 | Klein | G01R 15/185 324/234 |
| 2014/0198463 A1 | 7/2014 | Klein | |
| 2014/0210463 A1* | 7/2014 | Klein | G01R 33/0052 324/253 |
| 2014/0368147 A1* | 12/2014 | Barrenscheen | H02H 3/083 318/490 |
| 2015/0061660 A1* | 3/2015 | Nemoto | G01R 21/00 324/244 |

\* cited by examiner

SENSOR FOR MEASURING CURRENT IN A CONDUCTOR

CROSS-REFERENCE TO RELATED APPLICATIONS

This application is a U.S. national stage application under 35 U.S.C. § 371 of International Application No. PCT/EP2015/074418, filed on Oct. 21, 2015, and claims benefit to British Patent Application No. 1 419 192.8, filed on Oct. 29, 2014. The International Application was published in English on May 6, 2016, as WO 2016/066506 A1 under PCT Article 21(2).

FIELD

The invention relates to a sensor for measuring current in a conductor.

BACKGROUND

WO2013/034661 describes a sensor for measuring current in a conductor without making contact to the conductor. A first and a second magnetic bar of the sensor are placed on opposite sides of a through hole of a PCB. The first and second magnetic bar are parallel. The conductor sticks through the through hole in the PCB. A measurement coil and an excitation coil are wound around the first magnetic bar. Similarly, a measurement coil and an excitation coil are wound around the second magnetic bar such that the measurement coil and the excitation coil are concentric. The excitation coils are fed by a supply so as to regularly saturate the corresponding magnetic bars. The coils are each formed by tracks in metallization layers of the PCB, connected by vias. The changes in the current in the conductor are determined by adding and subtracting the currents through the four coils.

In many cases there are one or more other conductors in the neighborhood as well carrying a current. Such a current through the one or more other conductors will also cause a current through the measurement and excitation coils and may thus lead to an imprecise measurement of the current through the measurement coil. The current through the other conductors can have the effect that current through the measurement and excitation coils is either higher or larger than the actual current in the conductor.

SUMMARY

An aspect of the invention provides a sensor for measuring current in a conductor, the sensor comprising: a stack including an isolation layer, a first metallization layer, and a second metallization layer, the metallization layers being stacked in a z direction; a first winding including conductive material and a second winding including conductive material, the first winding and the second winding each including a first part, formed in at least one of the metallization layers included in the stack and mainly extending in a y direction and having a first center of gravity, and a second part, formed in at least one of the metallization layers included in the stack and mainly extending in a direction opposite to the y direction and having a second center of gravity; and a measurer configured to measure current through the first winding and current through the second winding, wherein the first center of gravity of the first winding and the second center of gravity of the first winding are in a first plane, wherein the first center of gravity of the second winding and the second center of gravity of the second winding are in a second plane, wherein the first plane intersects with the second plane in a common intersection line in the y direction, and wherein the z direction and the y direction are mutually orthogonal.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
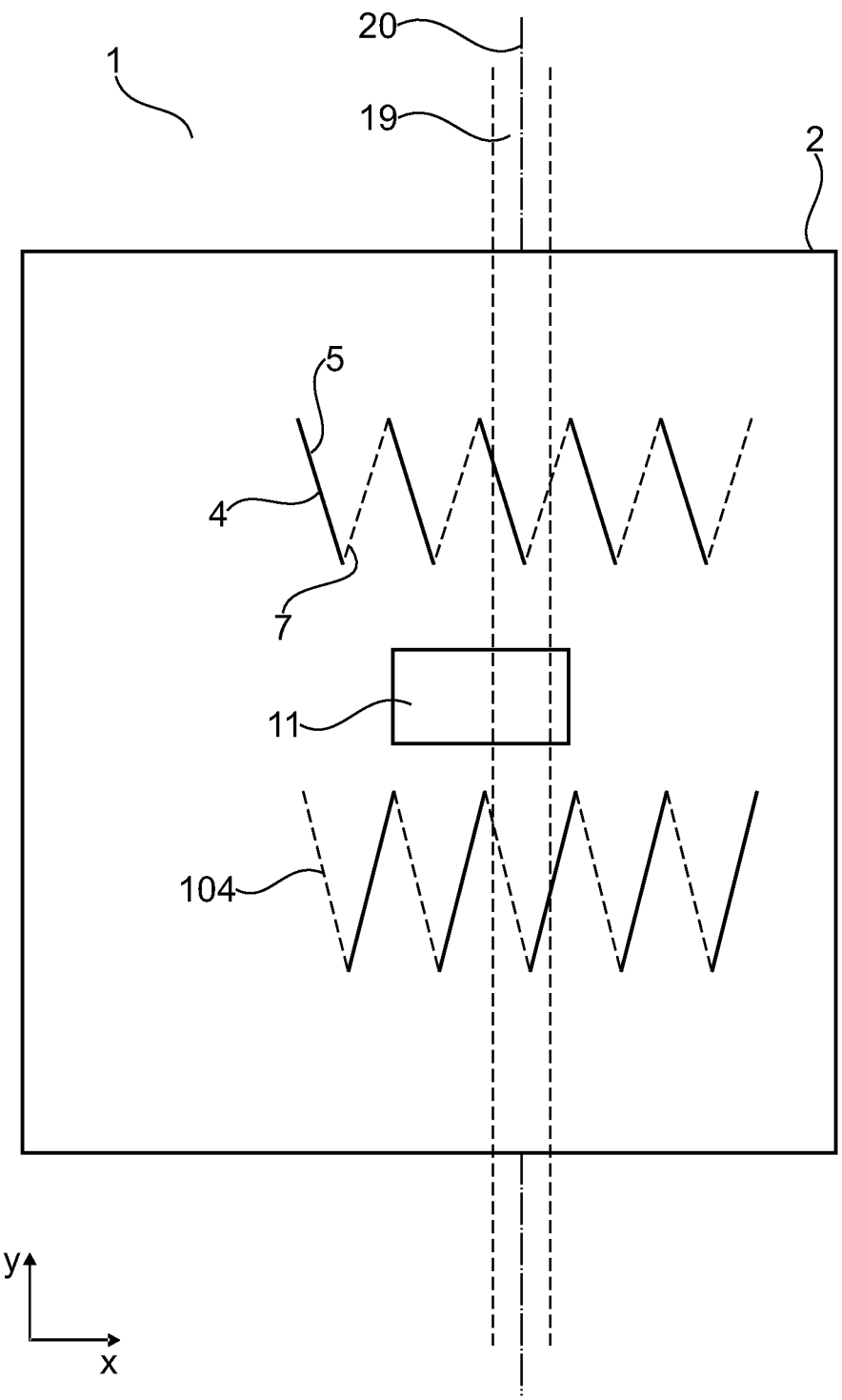
FIG. 1 sensor according to the invention, top view.

An aspect of the invention increases the precision of the measurement of current through a conductor by such a sensor.

As the first winding and the second winding are of conductive material a current can be generated in the first winding or the second winding with a changing magnetic field. The two parts of the first winding and of the second winding are conductive as the first winding and the second winding are of conductive material and thus can be realized in a metallization layer of for example a PCB. For each winding, the first part has a first center of gravity and the second part has a second center of gravity. As the planes through the first center of gravity and the second center of gravity for the first and second windings intersect in a common intersection line in the second direction, the common intersection line in the second direction is also comprised in both the first plane and the second plane. Together with the first center of gravity of the first winding and the second center of gravity of the first winding the common intersection line defines the first plane. Similarly the combination of the first center of gravity of the second winding, the second center of gravity of the second winding and the common intersection line defines the second plane.

As the first plane and the second plane intersect in a line, they are not parallel and the directional sensitivity of the windings differs.

By measuring current through the first winding and current through the second winding with the measurement means, this difference in directional sensitivity is comprised in the measurement or measurements.

As used herein, "mainly extending in the second direction" means that the absolute value of the difference between the coordinates of the end points of the first part or as the case may be the second part in the second direction is larger than the absolute value of the difference between the coordinates of those end points in the two directions orthogonal to the second direction.

With the first part and the second part formed in metallization layers, the sensor does not need to be large but can be compact and especially does not need a high building height in the first direction.

The difference in angle may come from a the difference between the coordinates in the first-direction of the first center of gravity and the second center of gravity being different for the first winding and the second winding. The difference may also be in the coordinates in the direction orthogonal to both the first direction and the second direction or both.

In a typical further embodiment the first part and the second part of both the first winding and the second are in different metallization layers.

A second embodiment of the invention is provided with the first part and the second part of the first winding being in different metallization layers of the stack and the first part and the second part of the second winding being in a first metallization layer of the stack only, the first plane and the second plane are not parallel.

The advantage of this embodiment is that the second winding is more sensitive to current flowing through a conductor parallel to the second direction, wherein the conductor is in the plane of the first metallization layer than the first winding.

In many occasions, the conductors in an electrical system are designed to extend in of three orthogonal directions and the sensor can be aligned such that the second direction is parallel to one of them.

A third embodiment of the invention is provided with the first intersection line and the second intersection line at opposite angles of equal value, the sensor has two directions in which the windings are most sensitive and those two directions are symmetrical around the first direction.

Such a symmetry can be advantageous for suppressing magnetic fields from undesired sources positioned certain directions or for enabling an accurate correction on a current in a certain direction.

A fourth embodiment of the invention is provided by a sensor having additional first windings connected in series with the first winding, the current flowing through the additional first windings also flows through the first winding. This means that when measuring current through the first winding, current through the additional first windings is measured as well.

Since in addition the additional first plane corresponding to directional sensitivity of the additional first windings is parallel to the first plane corresponding to the directional sensitivity of the first winding, it also means that a larger current is induced compared to the current induced by only the first winding and that therefore current through the first winding can be determined more precisely without decreasing precision caused by lowering directional sensitivity.

A fifth embodiment of the invention is provided by a sensor
in which the windings are in different circuits, they are not in series. Therefore the influence of the current in the first winding and the second winding has a low correlation. By separately (individually) measuring the current in the first winding and the second winding and comparing the currents measured in the first winding and the second winding the strength and direction of different changing magnetic fields can be determined, which in turn can be used to determine direction and changes in currents.

A sixth embodiment of the invention is provided by a sensor
in which the first winding and the second winding are connected in series with each other, current flowing through the first winding also flows through the second winding. This can be used to measure current flowing through a conductor in a direction for which say the first winding is optimized and at the same time correcting for magnetic noise fields. Such magnetic noise fields may for instance correspond to currents through conductors positioned in other directions that are not to be measured.

A seventh embodiment of the invention is provided by a sensor
in which the difference in directional sensitivity of the first winding and the second winding cancel out, the coil has a large sensitivity in the direction in which both the first winding and the second winding have a large directional sensitivity compared to a coil comprising only the first winding or the second winding, while being less sensitive to changes in magnetic fields in other directions.

As used herein, "metallization layer" is used for a layer on the stratified part in which one or more conductive tracks are made, electrically connecting different electrical components to each another. Generally, the metallization layer is obtained by depositing a uniform layer of a conductive material, typically a metal such as copper, and then etching this uniform layer to allow only the conductive tracks to remain.

As used herein, "non-magnetic material" is used for a material with a very low magnetic susceptibility.

As used herein, "low voltage systems" are systems that are used downstream of a power supply in an electrical power grid that typically are arranged to handle voltages up to 1000 V AC or 1500 V DC. The maximum allowable load current range is for example 740 A, 985 A or 1420 A. The corresponding respective short circuit values are 73.5, 105 and 176 kA for the so-called $I_{pk}$. An example of a module for such a low voltage system is a motor starter.

As used herein in the influence of a changing magnetic field of current in a conductor other than the conductor of which the current is to be measured is considered as noise leading to a lower precision.

Examples of embodiments the invention will now be described with reference to the accompanying schematic drawings. Corresponding reference symbols in the schematic drawings indicate corresponding parts. The schematic drawings are not necessarily to scale and certain features may be exaggerated to better illustrate and explain the present invention. Further, the examples are not intended to be exhaustive or otherwise limit or restrict the invention to the precise configurations shown in the drawings and disclosed in the following detailed description.

For the purpose of explaining the invention, use is made of an x-direction, a y-direction and a z-direction, which are all perpendicular and chosen in right-handed orientation. A corresponding Cartesian coordinate system is used as well.

In the following examples of the invention, the positive z-direction is a vertical upward direction, i.e. the negative z-direction is the direction of the force of gravity.

First Example

Figure 2:
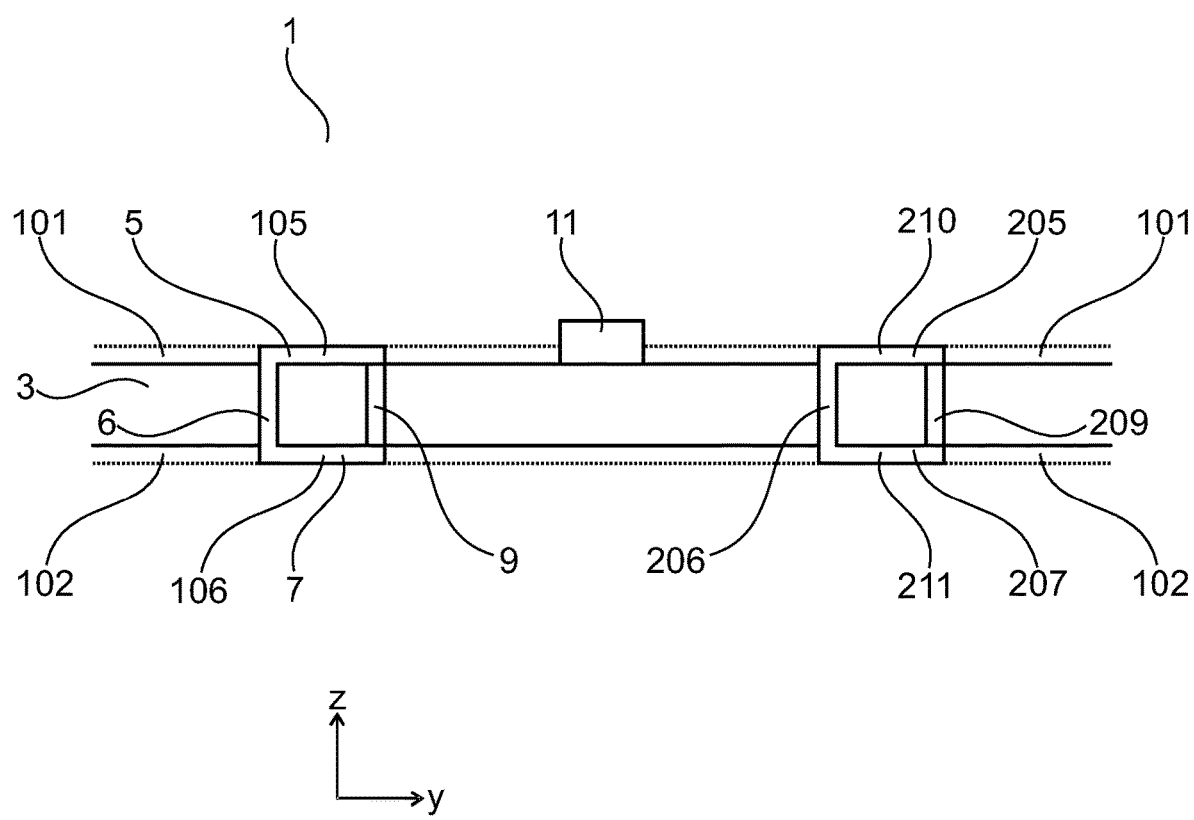
FIG. 2 sensor according to the invention, side view cross section.

A sensor (1) according to a first example of the invention comprises a printed circuit board (PCB) (2) (see FIG. 1 and FIG. 2). The PCB (2) is formed as a stratified part, such as a plate, with layers stacked in the z-direction. The side of the PCB (2) with the largest z-coordinate is herein referred to as the topside of the PCB (2), the side of the PCB (2) with the smallest z-coordinate is herein referred to as the bottom side of the PCB (2). A top view of the sensor (i.e. a view in negative z-direction) is shown in FIG. 1, a side view is shown in FIG. 2.

The PCB (2) comprises an isolation layer (3) of non-magnetic material such as fiberglass or epoxy resin. In this example the non-magnetic material is an epoxy resin.

The PCB (2) comprises a first coil (4) and a second coil (104) which are formed by printed, conductive tracks and vias (i.e. conducting connections between different metallization layers through the isolation layer (3). The tracks are formed from Copper. Copper is a non-magnetic material.

Each track has two end points and extends along the y-direction from a first y-coordinate to a second y-coordinate, i.e. the end points of the track are either at the first y-coordinate or the second y-coordinate. It also extends along the x-direction from a first x-coordinate to a second x-coordinate. At each y-coordinate, for different tracks the end points of the track are at different x-coordinates or have one end point with the same x-coordinate as an end point of another track in case these end points are connected by a via. The tracks may be curved. In this example however they have a straight form. Each track is within a metallization layer, which means that the z-coordinates of the end points are equal to each other. Each track however mainly extends in the y-direction. This means that the absolute value of the difference between the first y-coordinate and the second y-coordinate is larger than the absolute value of the difference between the first x-coordinate and the second x-coordinate. It is also larger than the absolute value of the difference between the first z-coordinate and the second z-coordinate.

A first winding of the first coil (4) is further described in more detail with reference to FIG. 3.

The first winding comprises a first part (5) in a first metallization layer (101) and a second part (7) in a second metallization layer (102). The first metallization layer (101) is at the topside of the PCB (2), the second metallization layer (102) is a bottom side of the PCB (2). At an end point, the first part is connected to an end point of the second part (7) by a via (6). At another end point of the second part (7), the first winding is connected to an additional first winding by an additional via (9). The first winding and the additional first winding are adjacent windings.

The first part (5) has a first center of gravity (105) at coordinates (x105, y105, z105). The first part (5) is symmetrical around the first center of gravity (105). The position of the first center of gravity (105) is in the middle between the end points of the first part (5).

The second part has a second center of gravity (106) at coordinates (x106,y106,z106). The second part (7) is symmetrical around the second center of gravity (106). The position of the second center of gravity (106) is in the middle between the end points of the second part (7).

The x-coordinate (x106) of the second center of gravity (106) is larger than the x-coordinate (x105) of the first center of gravity (105).

The coordinates in the y-direction of the first center of gravity (105) and the second center of gravity (106) are equal.

The z-coordinate (z106) of the second center of gravity (106) is smaller than the z-coordinate (z105) of the first center of gravity (105).

The additional first winding is built up the same way as the first winding, i.e. it is a copy of the first winding placed at a different position in the x-direction, i.e. the additional first winding can be seen as a translated version of the first winding with larger x-coordinates. The first coil (4) comprises a number of such additional first windings and comprises a further additional first winding at smaller x-coordinates. This further additional first winding also is a further copy of the first winding.

To explain the directional sensitivity of the first coil (4) a first plane 120 is defined by comprising a line in the y-direction and a line connecting the first center of gravity (105) and the second center of gravity (106). The intersection of this first plane 120 with a reference plane perpendicular to the y-direction is a first intersection line. The direction of this first intersection line corresponds to the direction in which the first coil (4) is most sensitive to changes in the magnetic field, i.e. changes in the magnetic field in this direction lead to the largest current in the first coil (4).

Figure 4:
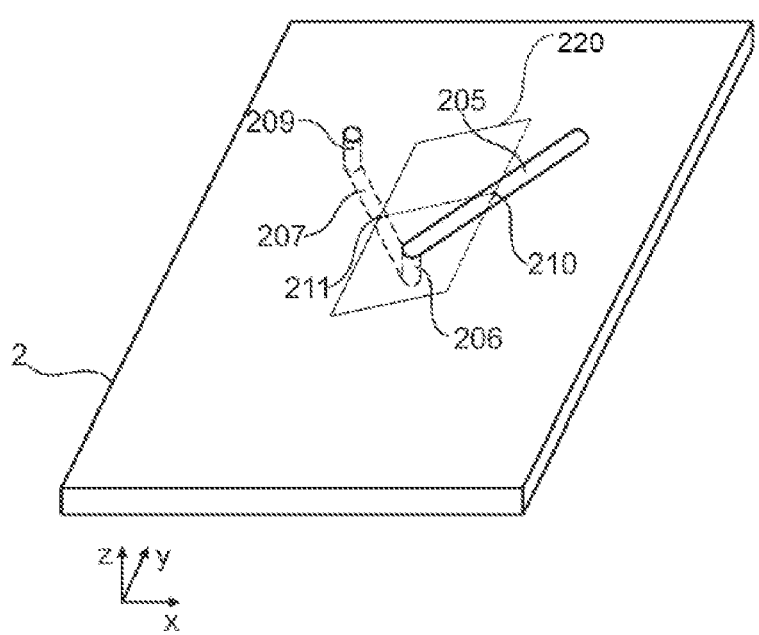
FIG. 4 second winding according to the first and second example.

A second winding of the second coil (104) is further described in more detail with reference to FIG. 4.

The second winding comprises a first part (205) in the first metallization layer (101) and a second part (207) in the second metallization layer (102). At an end point, the first part is connected to an end point of the second part (207) by a second via (206). At another end point of the second part (207), the second winding is connected to an additional second winding by an additional second via (209). The second winding and the additional second winding are adjacent windings.

The first part (205) has a first center of gravity (210) at coordinates (x210, y210, z210). The first part (205) is symmetrical around the first center of gravity (210). The position of the first center of gravity (210) is in the middle between the end points of the first part (205).

The second part (207) has a second center of gravity (211) at coordinates (x211,y211,z211). The second part (207) is symmetrical around the second center of gravity (211). The position of the second center of gravity (211) is in the middle between the end points of the second part (207).

The x-coordinate (x211) of the second center of gravity (211) is smaller than the x-coordinate (x210) of the first center of gravity (205).

The coordinates in the y-direction of the first center of gravity (210) and the second center of gravity (211) are equal.

The z-coordinate (z211) of the second center of gravity (106) is smaller than the z-coordinate (z210) of the first center of gravity (210).

The additional second winding is built up like the second winding, i.e. it is a copy of the second winding wherein only the x-coordinates are smaller. The second coil (104) comprises a number of such additional second windings and comprises a further additional second winding at larger x-coordinates. This further additional second winding also is a further copy of the second winding.

To explain the directional sensitivity of the second coil (104) a second plane 220 is defined by comprising a line in the y-direction and a second line connecting the first center of gravity (210) and the second center of gravity (211). The intersection of this second plane 220 with a reference plane perpendicular to they-direction is a second intersection line. The direction of this second intersection line corresponds to the direction in which the second coil (104) is most sensitive to changes in the magnetic field, i.e. changes in the magnetic field in this direction lead to the largest current in the second coil (104).

Because the difference between the coordinates of the first center of gravity (105) of the first winding and the second center of gravity (106) of the first winding differs from the difference between the coordinates of the first center of gravity (210) of the second winding and the second center of gravity (211) of the second winding, the first intersection line and the second intersection line have different directions. Moreover, as in addition both the first intersection line and the second intersection line are in the reference plane, the first line and the second line cut each other. In this example, the z-direction is the bisection between the first intersection line and the second intersection line, i.e. the first intersection line and the second intersection line are at opposite angles to the z-direction.

As the lines cut each other, the absolute value of the angle between the lines is larger than zero degrees.

Moreover, as the lines cut each other, the first plane and the second plane intersect at a common intersection line in the y-direction.

That the first intersection line and the second intersection line have different directions, means that the maximal sensitivity of the first winding and the second winding differs. As the additional first windings and the further additional first winding are copies of the first winding with different x-coordinates, they all have a maximum sensitivity in the same direction as the first winding. As the additional second windings and the further additional second wind are copies of the second winding with different x-coordinates, they all have a maximum sensitivity in the same direction as the second winding.

The first coil (4) and the second coil (104) are in different electrical circuits and are not series connected. The PCB (2) further comprises means (11) to measure the current in the first coil (4) and in the second coil (104) separately. The measurement means (11) is also arranged to compare the current measured in the first coil (4) and the current measured in the second coil (104) with computation means. Based on the outcome of the comparison the current in the first coil may be corrected or the current in two conductors in two different directions may be determined.

In use a conductor (19) is situated proximate to the sensor (1) such that it extends parallel to the y-direction. The conductor (19) is symmetric around an axis of symmetry (20). The axis of symmetry (20) is part of a plane of symmetry of the conductor (19) perpendicular to the x-axis.

The plane of symmetry divides both the first coil (4) and the second coil (104) each in equal halves. The first coil (4) and the second coil (104) have the same number of windings (here 5 windings), and have the same dimension in x-direction.

The sensor (1) may be used in a drawer of a low voltage switchgear cabinet. The switchgear drawer has main contacts arranged to make contact to distribution bus bars. The main contacts are connected to a switch. The switch is connected by cables to auxiliary contacts that are arranged to make contact to an auxiliary circuit to feed the auxiliary circuit with power from the distribution bus bars.

The conductor (19) is one of the cables running from a switch in the switchgear drawer to an auxiliary contact.

The sensor is used to measure current in the conductor with high accuracy and may be used as well to measure current in an additional conductor positioned in another direction the conductor (19).

Second Example

In a second example, the first coil (4) and the second (104) as described for the first example are connected in series. The means for measuring current through the first coil (4) therefore automatically also measure current through the second coil (104). As the first coil (4) and the second coil (104) have equal dimension in the x-direction and the same number of windings, the z-direction is the bisection between the first intersection line and the second intersection line, i.e. as the directional sensitivities of the first coil (4) and the second coil (104) are at opposite angles, the direction in which the combination of the first coil (4) and the second coil (104) is most sensitive to changes in the magnetic field is the z-direction. Thus, the different in directional sensitivity between the first coil (4) and the second coil (104) cancels out.

Also in this second example, in use a conductor (19) is situated proximate to the sensor (1) such that it extends parallel to the y-direction. The conductor (19) is symmetric around an axis of symmetry (20). The axis of symmetry (20) is part of a plane of symmetry of the conductor (19) perpendicular to the x-axis.

The plane of symmetry divides both the first coil (4) and the second coil (104) each in equal halves.

The sensor (1) may be used in a drawer of a low voltage switchgear cabinet. The switchgear drawer has main contacts arranged to make contact to distribution bus bars. The main contacts are connected to a switch. The switch is connected by cables to auxiliary contacts that are arranged to make contact to an auxiliary circuit to feed the auxiliary circuit with power from the distribution bus bars.

The conductor (19) is one of the cables running from a switch in the switchgear drawer to an auxiliary contact.

The sensor is used to measure current in the conductor by measuring the current in the first winding and therefore also in the second winding.

With this configuration the direction in which the sensor is most sensitive to changes in the magnetic field coincides with the center line of the conductor, which means that is most sensitive to changes in the current in the conductor. It also means that the sensor is less sensitive to changes in the magnetic field around the sensor from other directions.

Third Example

A sensor (1) according to a third example also comprises a printed circuit board (PCB) (2). The PCB (2) is formed as a stratified part such as a plate, with layers stacked in the z-direction. The side of the PCB (2) with the largest z-coordinate is herein referred to as the topside of the PCB (2), the side of the PCB (2) with the smallest PCB (2) as the bottom side of the PCB (2).

The PCB (2) comprises an isolation layer (3) of non-magnetic material such as fiberglass or epoxy resin. In this example the non-magnetic material is an epoxy resin.

The PCB (2) comprises a first winding and a second winding, which are formed by printed, conductive tracks and vias (i.e. conducting connections between different metallization layers through the isolation layer (3). The tracks are formed from Copper. Copper is a non-magnetic material.

Each track has two end points and extends along the y-direction from a first y-coordinate to a second y-coordinate, i.e. the end points of the track are either at the first y-coordinate or the second y-coordinate. It also extends along the x-direction from a first x-coordinate to a second x-coordinate, i.e. the end points of the track are either at the first x-coordinate or the second x-coordinate. Each track is within a metallization layer, which means that the z-coordinates of the end points are equal to each other. Each track however mainly extends parallel to the y-direction. This means that the absolute value of the difference between the first y-coordinate and the second y-coordinate is larger than the absolute value of the difference between the first x-coordinate and the second x-coordinate. It is also larger than the absolute value of the difference between the first z-coordinate and the second z-coordinate.

Figure 3:
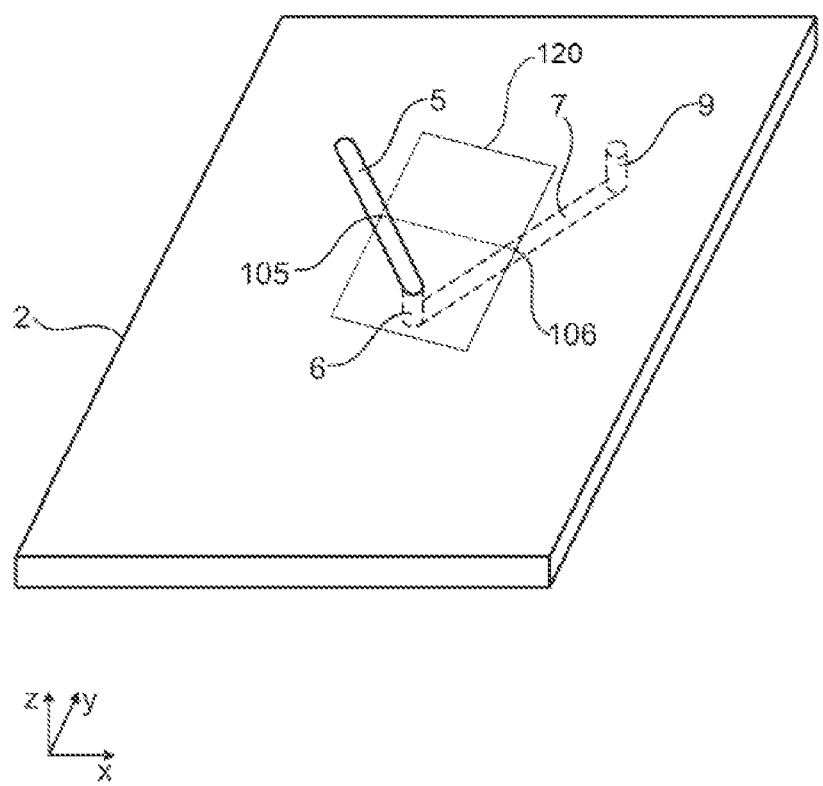
FIG. 3 first winding of the sensor according to the invention.

The first winding is as described for the first example in reference to FIG. 3. The only difference is that it is not connected to additional first tracks and to a further additional first track.

Figure 5:
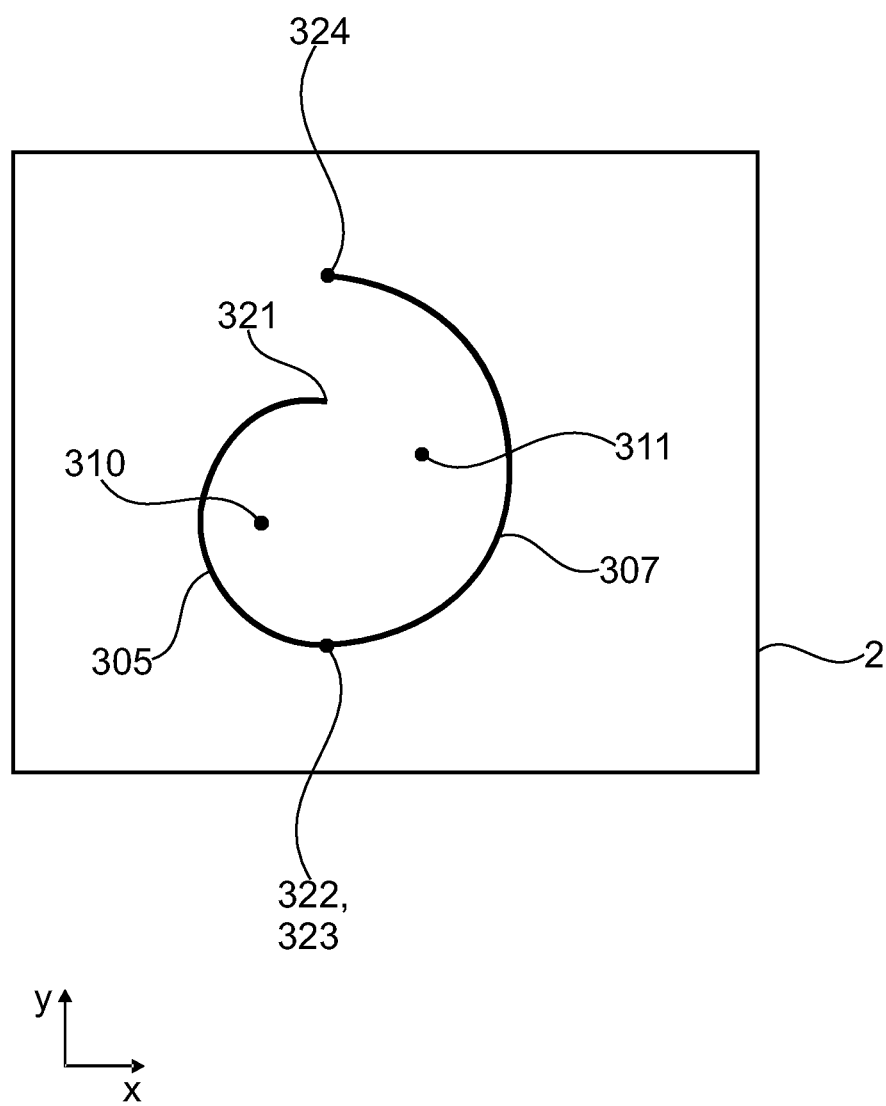
FIG. 5 second winding according the third example.

The second winding is further described with reference to FIG. 5. In FIG. 5 the first winding and the means (11) for measuring current in the first winding and the second winding are not shown.

The second winding comprises a first part (305) and second part (307) both in the first metallization layer (101). An end point (322) of the first part (305) coincides with an end point (323) of the second part (307). At another end point (324) of the second part (307) and at another end point (321) of the first part (305) the second winding is connected to measurement means (11) arranged to measure current through the second winding. The first part (307) has a first center of gravity (310) at coordinates (x310, y310, z310).

The second part (307) has a second center of gravity (311) at coordinates (x311, y311, z311).

The x-coordinate (x311) of the second center of gravity (311) is larger than the x-coordinate (x310) of the first center of gravity (305).

The y-coordinate (y311) of the second center of gravity (311) is larger than the y-coordinate (y310) of the first center of gravity (310).

The z-coordinate (z311) of the second center of gravity (311) is equal to the z-coordinate (z310) of the first center of gravity (310).

The direction in which this second winding is has maximal sensitivity to changes in magnetic fields is in a plane perpendicular to the z-direction.

The first winding and the second winding are in different electrical circuits and are not series connected. The sensor (1) is arranged to measure the current in the first winding and in the second winding separately with means (11). The means (11) is also arranged to compare the current measured in the first winding and the current measured in the second winding with computation means. Based on the outcome of the comparison, the current in the first winding may be corrected or the current in two conductors in two different directions may be determined.

In use a conductor (19) is situated proximate to the sensor (1) such that it extends parallel to the y-direction. The conductor (19) is symmetric around an axis of symmetry (20). The axis of symmetry (20) is part of a plane of symmetry of the conductor (19) perpendicular to the x-axis.

The plane of symmetry divides the first winding in equal halves.

The sensor (1) may be used in a drawer of a low voltage switchgear cabinet. The switchgear drawer has main contacts arranged to make contact to distribution bus bars. The main contacts are connected to a switch. The switch is connected by cables to auxiliary contacts that are arranged to make contact to an auxiliary circuit to feed the auxiliary circuit with power from the distribution bus bars.

The conductor (19) is one of the cables running from a switch in the switchgear drawer to an auxiliary contact.

The sensor is used to measure current in the conductor (19) with high accuracy and may be used as well to measure current in an additional conductor positioned in another direction the conductor (19).

Fourth Example

A sensor (1) according to a fourth example comprises a PCB (2) similar to the PCB described for the first example.

The sensor (1) further comprises a coil comprising a first winding which is formed in the same way as the first winding of the first coil of the first example described with reference to FIG. 3 except that it does not comprise the additional via (9). As the first winding is formed the same way as the first winding of the first example, it also has a first part with a first center of gravity and a second part with a second center of gravity.

The coil also comprises a second winding which is formed in the same way as the second winding of the second coil of the first example described with reference to FIG. 4. As the second winding is formed the same way as the second winding of the first example, it also has a first part with a first center of gravity and a second part with a second center of gravity. The first winding is connected to the second winding at the end of the second part with the largest x- and y-coordinate. The second winding is connected to the first winding at the end of the first part with the smallest x-coordinate and the largest y-coordinate. Both ends are in the same metallization layer.

The y-coordinate where the first winding and the second winding connect, corresponds to the y-coordinate of the conductor of which the current is to be measured with the sensor (1).

To explain the directional sensitivity of the coil, a first plane is defined by comprising a line in the y-direction and a line connecting the first center of gravity and the second center of gravity of the first winding. The intersection of this first plane with a reference plane perpendicular to the y-direction is a first intersection line. The direction of this first intersection line corresponds to the direction in which the first winding is most sensitive to changes in the magnetic field.

A second plane is defined by comprising a line in the y-direction and a second line connecting the first center of gravity and the second center of gravity of the second winding. The intersection of this second plane with the reference plane perpendicular to the y-direction is a second intersection line. The direction of this second intersection line corresponds to the direction in which the second winding is most sensitive to changes in the magnetic field.

The first line and the second line cross each other. The angle between the first line and the z-direction is equal to the angle between the z-direction and the second line. The difference in sensitivity in the x-direction between the first winding and the second winding cancels out. This means that the coil has maximal sensitivity in the direction of the z-direction.

As in use the conductor is expected to be in the z-direction and at the y-coordinate where the first winding and the second winding join, the sensor (1) has maximal sensitivity in the direction of the conductor.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B, and C" should be interpreted as one or more of a group of elements consisting of A, B, and C, and should not be interpreted as requiring at least one of each of the listed elements A, B, and C, regardless of whether A, B, and C are related as categories or otherwise. Moreover, the recitation of "A, B, and/or C" or "at least one of A, B, or C" should be interpreted as including any singular entity from the listed elements, e.g., A, any subset from the listed elements, e.g., A and B, or the entire list of elements A, B, and C.

The invention claimed is:

1. A sensor for measuring current in a conductor, the sensor comprising:
    a stack including an isolation layer, a first metallization layer, and a second metallization layer, the first and second metallization layers being stacked in a z direction;
    a first winding and a second winding each including a conductive material, the first winding and the second winding each including a first part, formed in at least one of the metallization layers included in the stack and mainly extending in a y direction and having a first center of gravity, and a second part, formed in at least one of the metallization layers included in the stack and mainly extending in a direction opposite to the y direction and having a second center of gravity; and
    a measurer configured to measure current through the first winding and current through the second winding,
    wherein the first center of gravity of the first winding and the second center of gravity of the first winding are in a first plane,
    wherein the first center of gravity of the second winding and the second center of gravity of the second winding are in a second plane,
    wherein the first plane intersects with the second plane in a common intersection line in the y direction, and
    wherein the z direction and the y direction are mutually orthogonal.

2. The sensor of claim 1, wherein the first and second part of the first winding are in different metallization layers, included in the stack, and
    wherein the first and second part of the second winding are in the first metallization layer included in the stack.

3. The sensor of claim 1, further comprising:
    an additional first winding including the conductive material, connected in series with the first winding, the additional first winding including:
    a first part, formed in the first metallization layer included in the stack and mainly extending in the y direction and having a first center of gravity, and
    a second part, formed in the second metallization layers included in the stack and mainly extending in a direction opposite to the y direction and having a second center of gravity,
    wherein the first center of gravity of the additional first winding and the second center of gravity of the additional first winding being on an additional first line included in an additional first plane, and
    wherein the additional first plane is parallel to the first plane.

4. The sensor of claim 1, wherein the first winding and the second winding are in different circuits,
    wherein the measurer is configured to measure current in the first winding and the second winding individually, and
    wherein the sensor further comprises a comparer configured to compare the measured currents.

5. The sensor of claim 1, wherein the first winding and the second winding are connected in series with each other.

6. A sensor for measuring current in a conductor, the sensor comprising:
    a stack including an isolation layer, a first metallization layer, and a second metallization layer, the first and second metallization layers being stacked in a z direction;
    a first winding and a second winding each including a conductive material, the first winding and the second winding each including a first part, formed in at least one of the metallization layers included in the stack and mainly extending in a y direction and having a first center of gravity, and a second part, formed in at least one of the metallization layers included in the stack and mainly extending in a direction opposite to the y direction and having a second center of gravity; and
    a measurer configured to measure current through the first winding and current through the second winding,
    wherein the first center of gravity of the first winding and the second center of gravity of the first winding are in a first plane,
    wherein the first center of gravity of the second winding and the second center of gravity of the second winding are in a second plane,
    wherein the first plane intersects with the second plane in a common intersection line in the y direction,
    wherein the z direction and the y direction are mutually orthogonal, and
    wherein a first intersection line of the first plane with a reference plane perpendicular to the y direction and a second intersection line of the second plane with the reference plane are at opposite angles with equal value in the z direction.

7. The sensor of claim 5, wherein the first winding and the second winding are windings of a coil.

8. The sensor of claim 6, wherein the first winding and the second winding are windings of a coil.

* * * * *